United States Patent [19]
Seki

[11] Patent Number: 5,402,253
[45] Date of Patent: Mar. 28, 1995

[54] COLOR CONVERSION METHOD AND APPARATUS WITH A VARIABLE GRAY COMPONENT REPLACEMENT RATIO

[75] Inventor: Noriaki Seki, Kanagawa, Japan

[73] Assignee: Fuji Xerox Co., Ltd., Tokyo, Japan

[21] Appl. No.: 108,288

[22] Filed: Aug. 19, 1993

[30] Foreign Application Priority Data

Aug. 20, 1992 [JP] Japan .................................. 4-242541

[51] Int. Cl.⁶ .......................... H04N 1/46; G03F 3/10
[52] U.S. Cl. .................................... 358/518; 358/520
[58] Field of Search ........................ 358/518, 520, 521

[56] References Cited

U.S. PATENT DOCUMENTS 5,231,504  7/1993  Magee ................... 358/520

FOREIGN PATENT DOCUMENTS 64-45642  2/1989  Japan .

OTHER PUBLICATIONS

"Considerations (I) on Black Addition in Printing", Sayanagi and Tamune, Proceedings of First Color Engineering Conference, 1–7, pp. 33–36 (1984).

"The Theory and Practice of Black Printer", Nakamura et al., Electrophotography The Society Journal 29(3):67–75 (1990).

"Color Masking (I)", J. Tajima, The Journal of the Institute of Image Electronics Engineers of Japan, 18(1):20–28 (1989).

"Color Masking (II)", J. Tajima, The Journal of the Institute of Image Electronics Engineers of Japan, 18(2):44–48 (1989).

Primary Examiner—Scott A. Rogers
Attorney, Agent, or Firm—Finnegan, Henderson, Farabow, Garrett & Dunner

[57] ABSTRACT

An amount of a black colorant is determined from input color image signals. Then, chromaticity values, for instance, on the L*H*C* color space, of a color that is obtained by subtracting the above black amount from the input color image signals and represented by C, M and Y are determined. Finally, colorant amounts of C, M and Y are determined from the chromaticity values thus determined.

3 Claims, 4 Drawing Sheets

COLOR CONVERSION METHOD AND APPARATUS WITH A VARIABLE GRAY COMPONENT REPLACEMENT RATIO

BACKGROUND OF THE INVENTION

The present invention relates to conversion from color image information to colorant signals of, for instance, cyan, magenta, yellow and black in digital color copiers, digital color printers, color facsimile machines, etc.

Digital color copiers etc. using colorants of cyan (C), magenta (M), yellow (Y) and black (B) are associated with a problem that in outputting a high-density black or dark gray image, black reproduced with three colorants of C, M and Y (hereinafter called "process black") is not perfectly black, i.e., slightly colored. Further, since the process black is produced as a superposition of the three colorants of C, M and Y, a misregistration of the three colorants causes a color blur around a black portion, which is a problem in printing black characters.

It is a common procedure to avoid the above problem that black is reproduced with a single colorant K (hereinafter called "single black") instead of process black. This procedure of using single black instead of process black to thereby decrease amounts of the colorants C, M and Y is called gray component replacement (GCR) or under color removal (UCR).

FIGS. 4(a) and 4(b) illustrate a conventional GCR technique. FIG. 4(a) shows colorant signals of C, M and Y for reproducing a certain color on a document in a digital color copier. As shown in FIG. 4(b), respective portions of the colorant amounts of C, M and Y, that is, portions associated with the minimum of the colorant amounts of C, M and Y, are replaced with a colorant amount of K. Those respective portions are subtracted from the colorant signals of C, M and Y.

However, since the above conventional technique is not properly supported by colorimetric theories, a desired color is not obtained and the chroma is much reduced. Various improvements have been proposed to avoid this problem.

Among those is a technique disclosed by Sayanagi and Tamune in "Considerations (I) on Black Addition in Printing," Proceedings of First Color Engineering Conference, 1-7, pp. 33-36, 1984. In this under color addition (UCA) technique, C, M and Y are added to prevent the chroma reduction.

In Japanese Patent Application Unexamined Publication No. Sho. 64-45642, color image signals are represented on the CIE 1976 L*a*b* uniform color space and colorant signals of C, M, Y and K are set so that their variations are approximately proportional to variations of chromaticity values on the L*a*b* uniform color space. With this technique, the colorant signals of C, M, Y and K can be determined by simple calculations.

According to the conventional techniques described above, the colorant signals of C, M, Y and K can be determined with a relatively high accuracy when the ratio of replacing the process black with the single black (hereinafter called "GCR ratio") is fixed. However, for the following reasons, the GCR ratio needs to be changed, for instance, in digital color copiers. In copying a text, it is desired that black characters be reproduced without causing color blurs by achromatic printing (GCR=100%) in which process black components are fully replaced by single black. On the other hand, in copying a natural image, the GCR ratio should be small because a large GCR ratio will cause a rough image.

Since the relationship between the three input image signals and the four colorant signals is not clearly defined, the types of conversion parameters to be changed and their variations are complex and unclear. Therefore, the conversion to the colorant signals of C, M, Y and K cannot be performed with a sufficient accuracy, to cause a problem that the color of output images varies with a variation of the GCR ratio.

SUMMARY OF THE INVENTION

An object of the present invention is to provide a clear relationship between input image signals and chromatic colorant signals to thereby enable easy determination of respective colorant signals.

Another object of the invention is to determine, with high accuracy, amounts of chromatic colorants which represent a color of chromatic components.

A further object of the invention is to minimize a variation of a printed color with respect to a variation of the GCR ratio.

According to the invention, a color conversion method for converting input color signals representing an input image into amounts of a plurality of chromatic colorants and at least one achromatic colorant to reproduce the input image on an image supporting member with those colorants, comprises the steps of:
  determining an amount of the achromatic colorant from the input color signals;
  determining chromaticity values of a color of chromatic components obtained by subtracting the determined amount of the achromatic colorant from the input color signals; and
  determining amounts of the chromatic colorants for representing the color of the chromatic components from the determined chromaticity values.

Further, according to the invention, a color conversion apparatus for converting input color signals representing an input image into amounts of a plurality of chromatic colorants and at least one achromatic colorant to reproduce the input image on an image supporting member with those colorants, comprises:
  means for determining an amount of the achromatic colorant from the input color signals;
  means for determining chromaticity values of a color of chromatic components obtained by subtracting the determined amount of the achromatic colorant from the input color signals; and
  means for determining amounts of the chromatic colorants for representing the color of the chromatic components from the determined chromaticity values.

DESCRIPTION OF THE PREFERRED EMBODIMENT

The present invention has been made based on the considerations and elucidations described below.

First, the characteristics of the C, M, Y and K colorants are discussed from the colorimetric viewpoint, which has not been done much conventionally. To simplify the subject, the printer is discussed, which works based on an ideal subtractive color mixture system.

Since commonly used K colorants, for instance, a carbon black, have a reflectance that has almost no dependence on the wavelength, the reflectance of a solid pattern of a K colorant can be approximated by $\rho_K$. Since the Lambert-Beer's low holds in the ideal subtractive color mixture system, the following relationship is established between an amount k of the K colorant and a reflectance $\rho(k)$:

$$\rho(k) = \rho_K{}^k \tag{1}$$

The following equations hold for a first color expressed by certain three colorants C, M and Y and a second color obtained by adding to the first color the K colorant of the amount k and expressed by the four colorants C, M, Y and K:

$$X(k) = \rho(k) \cdot X \tag{2a}$$

$$Y(k) = \rho(k) \cdot Y \tag{2b}$$

$$Z(k) = \rho(k) \cdot Z \tag{2c}$$

where X, Y and Z are tristimulus values of the first color and X(k), Y(k) and Z(k) are tristimulus values of the second color.

The tristimulus values X, Y and Z are converted to L*, a* and b* such that:

$$L^* = 116(Y/Y_0)^{\frac{1}{3}} - 16 \tag{3a}$$

$$a^* = 500\{(X/X_0)^{\frac{1}{3}} - (Y/Y_0)^{\frac{1}{3}}\} \tag{3b}$$

$$b^* = 200\{(Y/Y_0)^{\frac{1}{3}} - (Z/Z_0)^{\frac{1}{3}}\} \tag{3c}$$

where $X_0$, $Y_0$ and $Z_0$ are tristimulus values of reference white.

Similarly, L*(k), a*(k) and b*(k) are calculated from X(k), Y(k) and Z(k) such that:

$$\begin{aligned} L^*(k) &= 116\{Y(k)/Y_0\}^{\frac{1}{3}} - 16 \\ &= \rho(k)^{\frac{1}{3}}(L^* + 16) - 16 \end{aligned} \tag{4a}$$

$$\begin{aligned} a^*(k) &= 500[\{X(k)/X_0\}^{\frac{1}{3}} - \{Y(k)/Y_0\}^{\frac{1}{3}}] \\ &= \rho(k)^{\frac{1}{3}} a^* \end{aligned} \tag{4b}$$

$$\begin{aligned} b^*(k) &= 200[\{Y(k)/Y_0\}^{\frac{1}{3}} - \{Z(k)/Z_0\}^{\frac{1}{3}}] \\ &= \rho(k)^{\frac{1}{3}} b^* \end{aligned} \tag{4c}$$

By performing conversion from the L*a*b* color space to a cylindrical coordinate system, a hue H*(k) and a chroma C*(k) are obtained such that:

$$H^*(k) = \tan^{-1}\{b^*(k)/a^*(k)\} = \tan^{-1}(b^*/a^*) = H^* \tag{5a}$$

$$C^*(k) = [\{a^*(k)\}^2 + \{b^*(k)\}^2]^{\frac{1}{2}} = \rho(k)^{\frac{1}{3}} C^* \tag{5b}$$

where H* and C* are a hue and a chroma of the first color, respectively.

Figure 5A:
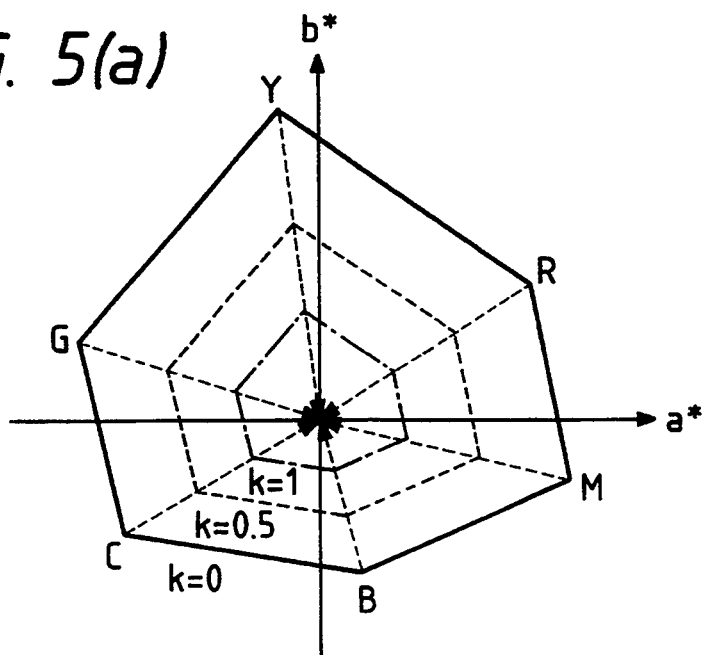
FIGS. 5(a) and 5(b) are graphs illustrating how chromaticity values vary on the L*a*b* or L*H*C* color space when an amount k of a K colorant is changed.
Figure 5B:
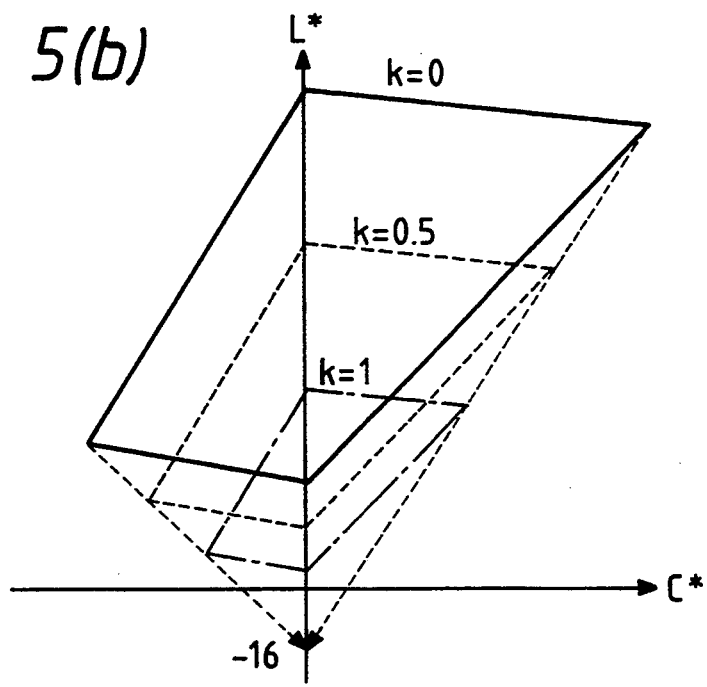

FIGS. 5(a) and 5(b) illustrate the above equations on the a*–b* plane and the L*–C* plane, respectively. Vertices of a hexagon drawn by a solid line in FIG. 5(a) represent chromaticity values of colors corresponding to the maximum densities of C, M, Y, R, G and B, respectively. The inside of the hexagon represents a color gamut of the three colors C, M and Y. Hexagons drawn by a dashed line and a chain line define color gamuts when the K colorant is added by k values of 0.5 and 1 (normalized so as to take values of 0 to 1), respectively. A tetragon drawn by a solid line, a dashed line and a chain line in FIG. 5(b) also define color gamuts of the three colors. From the above equations and FIGS. 5(a) and 5(b), it is understood that when the first color represented by the three colors C, M and Y changes to the second color by adding the K colorant, 1) the hue H* does not change, and
2) the color changes linearly on the L*–C* plane.

From the discussions described above in detail, it is understood that the input color image signals can be converted to the output CMYK signals according to the following procedure by determining, in advance, features as to how the chromaticity values vary on a proper color space, for instance, the L*H*C* space, when the colorant signals C, M, Y and K are changed. (The input color signals are regarded as a combination of the chromatic components represented by C, M and Y and the achromatic component represented by K.)

1) Determining the amount k of the K colorant from the input color image signals by a proper method (which may apparently be a known one).

2) Determining the chromaticity values of a color (represented by the three colors C, M and Y) obtained by subtracting the K colorant of the amount k from the input color image signals, based on the features of the chromaticity variation.

3) Determining amounts c, m and y of the respective colorants C, M and Y from the chromaticity values obtained in step 2) by a proper method (which may apparently be a conventional method such as a linear matrix method).

The above discussions are made using the L*a*b* color space (and the L*H*C* color space which is the cylindrical coordinate system corresponding to the former). It is apparent that a similar procedure can be obtained for each of other various color spaces such as the L*u*v*, YIQ and XYZ color spaces by simply switching the parameters of the above equations.

Figure 1:
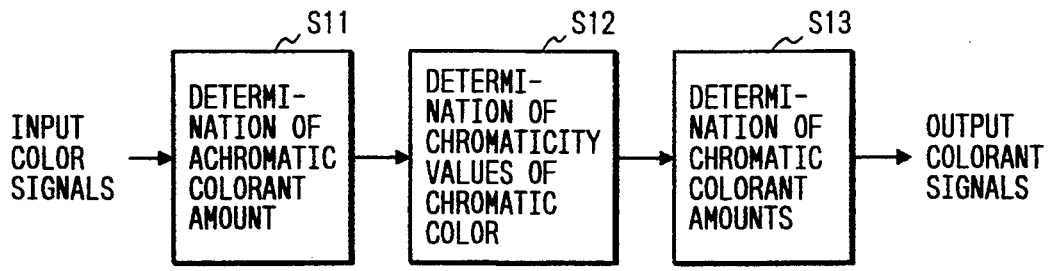
FIG. 1 shows a procedure of color signal conversion according to the present invention.

The above procedure is summarized in FIG. 1. In step S11, the achromatic colorant amount is determined from the input color signals. In step S12, the chromaticity values of a color obtained by subtracting the thus-determined achromatic colorant amount from the input color signals. Finally, in step S13, the chromatic colorant amounts to represent that color are determined from the chromaticity values determined in step S12.

An embodiment of the invention is described below in which the three chromatic colorants C, M and Y and the one achromatic colorant K are used and the L*a*b* color space or the L*H*C* color space which is the cylindrical coordinate system of the former is employed.

As described above, the chromaticity values L*, a* and b* of a first color represented by the three colors C, M and Y are correlated on the L*a*b* color space with the chromaticity values L*(k), a*(k) and b*(k) of a second color obtained by adding the colorant K by the amount k to the first color such that:

$$L^*(k) = \rho(k)^{\frac{1}{4}}(L^*+16)-16 \quad (6a)$$

$$H^*(k) = H^* \quad (6b)$$

$$C^*(k) = \rho(k)^{\frac{1}{4}}C^* \quad (6c)$$

where $\rho(k)$ denotes the reflectance of the colorant K of the amount k.

A description is made below of the case of reproducing input color signals O with the K colorant of the maximum amount and the three chromatic colorants, i.e., by the achromatic printing (GCR=100%). First, substitution of chromaticity values $L^*_0$, $H^*_0$ and $C^*_0$ of the input color signals O into $L^*(k)$, $H^*(k)$ and $C^*(k)$ of equations 6a–6c leads to the following simultaneous three linear equations for the chromaticity values $L^*$, $H^*$ and $C^*$ of the color (first color) represented by the three colors C, M and Y:

$$L^* = \rho(k)^{-\frac{1}{4}}(L^*_0+16)-16 \quad (7a)$$

$$H^* = H^*_0 \quad (7b)$$

$$C^* = \rho(k)^{-\frac{1}{4}}C^*_0 \quad (7c)$$

Figure 3A:
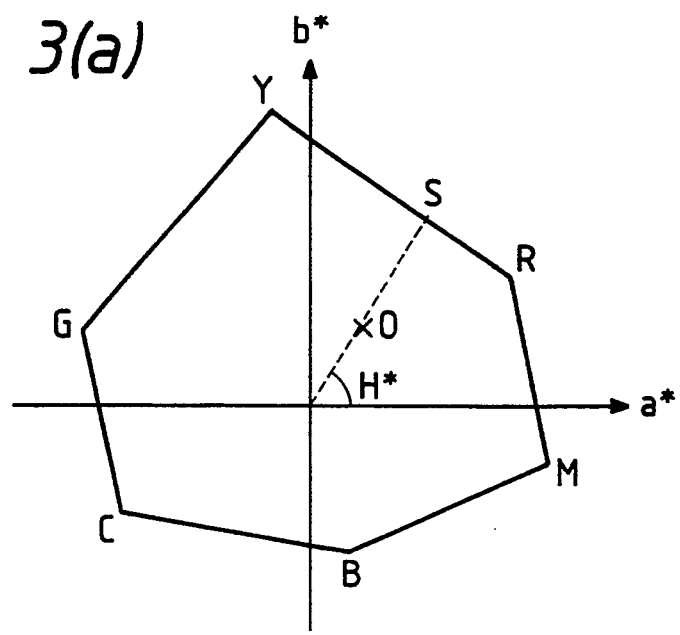
FIGS. 3(a) and 3(b) are graphs illustrating how chromaticity values of a color represented by three colors of C, M and Y are determined.
Figure 3B:
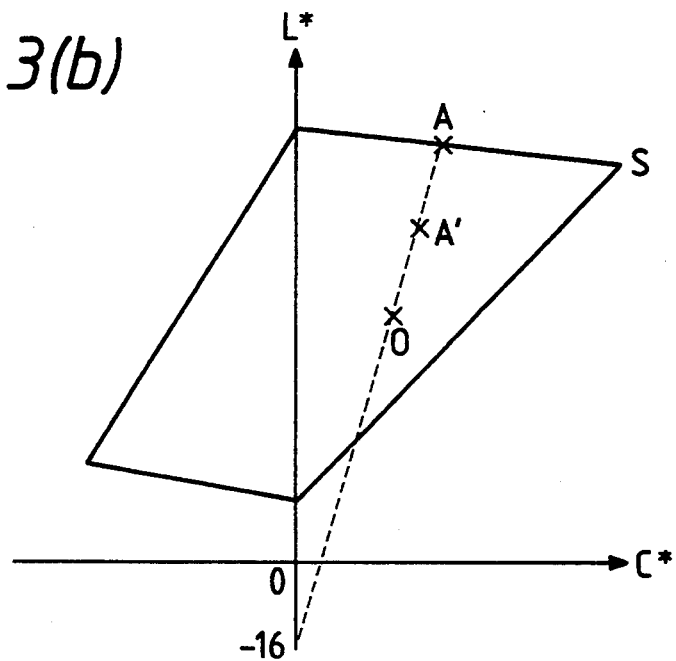
Figure 4A:
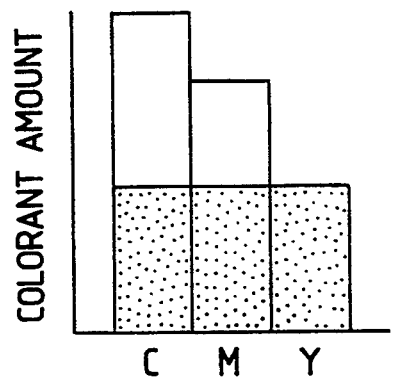
FIGS. 4(a) and 4(b) are graphs showing a conventional color conversion technique.
Figure 4B:
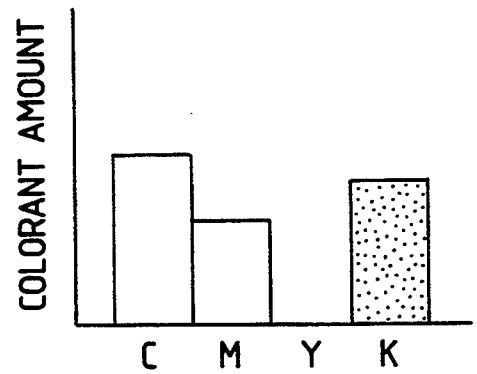

Dashed lines drawn on the a*-b* plane of FIG. 3(a) and the L*-C* plane of FIG. 3(b) represent equations 7a-7c. Point in each of FIGS. 3(a) and 3(b) represents the chromaticity values of the input color signals. Vertices of a hexagon in FIG. 3(a) represent chromaticity values of the maximum density colors of C, M, Y, R, G and B. The inside of the hexagon represents a color gamut of the three colors C, Y and Y. A tetragon in FIG. 3(b) also defines the color gamut of the three colors. Point S in each of FIGS. 3(a) and 3(b) represents chromaticity values of a color associated with the maximum chroma on a plane of $H^* = H^*_0$.

An intersecting point A of the dashed line and the outline of the three color gamut in FIG. 3(b) represents the chromaticity values of the color represented by the three colors C, M and Y. Therefore, $\rho(k)$ is obtained by substituting a chromaticity value $L^*_A$ of point A into equation 7a or by substituting a chromaticity value $C^*_A$ of point A into equation 7c. From the Lambert-Beer's law, the amount k is expressed such that:

$$k = \log \rho(k)/\log \rho_K. \quad (8)$$

Finally, the amount k of the K colorant in the case of the achromatic printing is determined if $\rho_K$ is measured in advance. A look-up table (LUT) corresponding to the above equation may be prepared.

Next, a description is made of a case where the GCR ratio is less than 100%, i.e., part of the achromatic component is not replaced with single black. In this case, an amount k' of the K colorant takes a value larger than 0 and smaller than k. From the amount k obtained above, the amount k' is expressed by:

$$k' = f(k) \quad (9)$$

where f(k) is a function suitable for the input color signals and determined in advance. A LUT may be prepared for the function f(k).

Chromaticity values $L^*_{A'}$, $C^*_{A'}$ and $H^*_{A'}$ (=$H^*$) of a color A' represented by the three colors C, M and Y are determined by calculating $\rho(k')$ from the amount k' obtained above, and then substituting $\rho(k')$ into equations 7a–7c.

To determine the colorant amounts of C, M and Y from the above-obtained $L^*_A$, $H^*_A$ and $C^*_A$ or $L^*_{A'}$, $H^*_{A'}$ and $C^*_{A'}$, the known techniques using the linear matrix operation, nonlinear matrix operation or direct mapping may be used.

With the above-described procedure, highly accurate color conversion can be realized in which the output color does not vary with respect to a variation of the GCR ratio and has only a small color difference from the input color signals.

Figure 2:
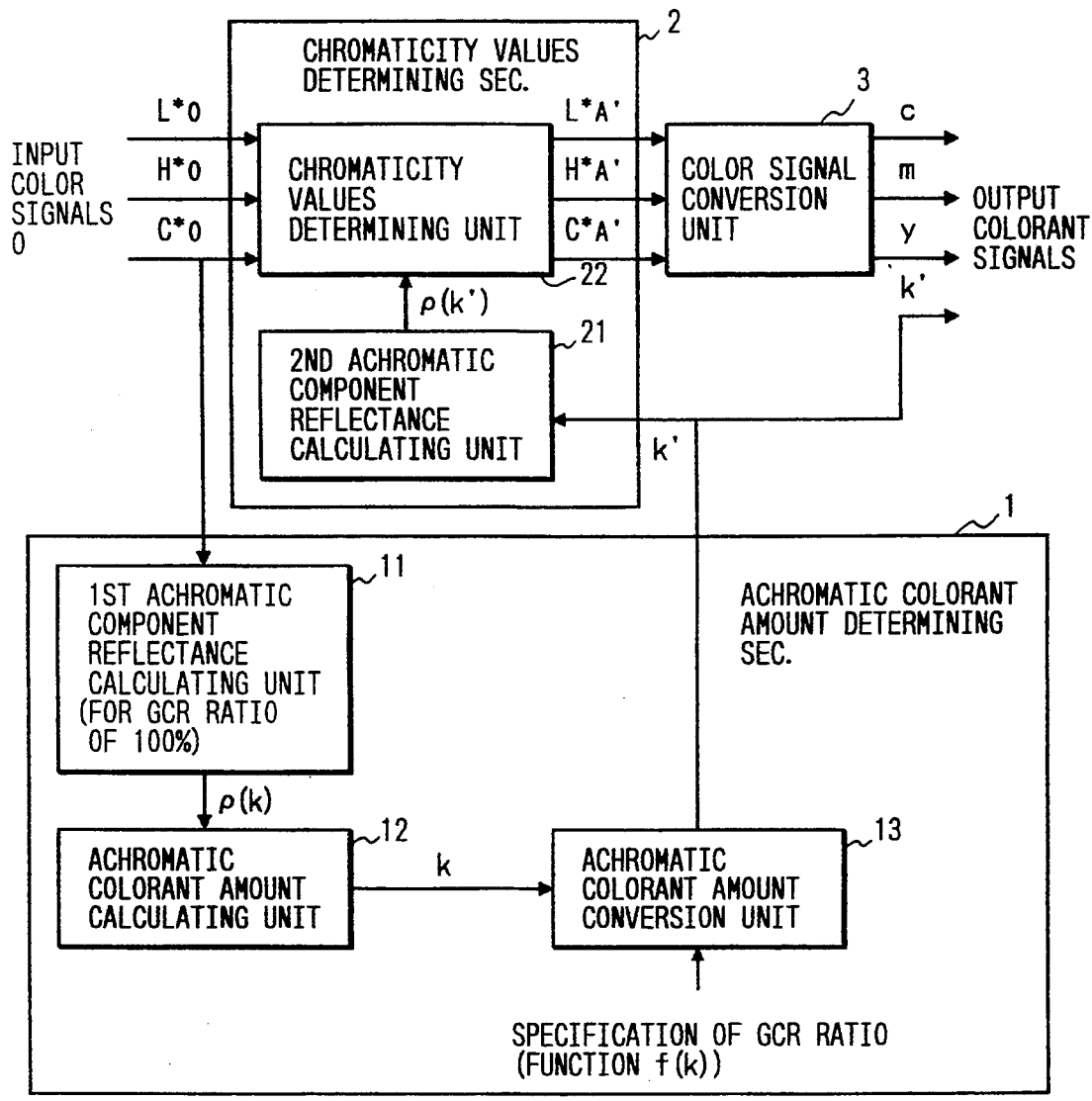
FIG. 2 is a block diagram showing constitution of a color signal conversion apparatus according to an embodiment of the invention.

FIG. 2 shows an example of an apparatus for performing the procedure described above.

The color conversion apparatus of FIG. 2 consists of the following units. A first achromatic component reflectance calculating unit 11 calculates the achromatic component reflectance $\rho(k)$ for the GCR ratio of 100%. An achromatic colorant amount calculating unit 12 calculates the achromatic colorant amount k based on the achromatic component reflectance calculated by the unit 11. An achromatic colorant amount conversion unit 13 converts the achromatic colorant amount k to the achromatic colorant amount k' corresponding to a specified GCR ratio. A second achromatic color component reflectance calculating unit 21 calculates $\rho(k')$ corresponding to the specified GCR ratio based on the achromatic colorant amount k' calculated by the unit 13. A chromaticity values determining unit 22 calculates the chromaticity values of a color of the chromatic components obtained by subtracting colorant amounts corresponding to the achromatic colorant amount k' from the input color signals. A color signal conversion unit 3 calculates the chromatic colorant amounts for representing the color of the chromatic components from the chromaticity values determined by the unit 22.

The first achromatic component reflectance calculating unit 11 calculates the achromatic component reflectance $\rho(k)$ for the GCR ratio of 100% by substituting into equation 7c the chromaticity value $C^*_0$ of the input color signals and the chromaticity value $C^*_A$ of the intersecting point A in FIG. 3(a). Alternatively, the achromatic component reflectance $\rho(k)$ may be calculated using equation 7a.

The achromatic colorant amount calculating unit 12 determines the achromatic colorant amount k for the GCR ratio of 100% by substituting the achromatic component reflectance $\rho(k)$ calculated by the unit 11 into equation 8. The reflectance $\rho_K$ is measured in advance and stored in a proper memory means, and is read from the memory means when it is substituted into equation 8. The achromatic colorant amount calculating unit 12 may be so constructed as to reference a LUT representing equation 8.

The achromatic colorant amount conversion unit 13 calculates the achromatic colorant amount k' using equation 9. The function f(k) is determined in advance as a function suitable for the input color signals, and can be set properly by an operator in accordance with the input color signals. The unit 13 may be so constructed as to reference a LUT representing equation 9.

The second achromatic component reflectance calculating unit 21 calculates $\rho(k')$ from the above-determined amount k' using equation 8. The unit 21 may be so constructed as to reference a LUT representing equation 8.

The chromaticity values determining unit 22 determines the chromaticity values $L^*_{A'}$, $C^*_{A'}$ and $H^*_{A'}$ (=$H^*$) of the color A' represented by the three colors C, M and Y by substituting $\rho(k')$ into equations 7a-7c.

The color signal conversion unit 3 determines the colorant amounts of C, M and Y from $L^*_{A'}$, $C^*_{A'}$ and $H^*_{A'}$. The unit 3 can be constructed easily by employing the conventional techniques based on the linear matrix operation, nonlinear matrix operation or direct mapping.

While in the above embodiment the L*a*b* color space (and the L*H*C* color space which is the cylindrical coordinate system of the former) is used, other various color spaces such as the L*u*v*, YIQ and XYZ color spaces can also be used simply by switching the parameters of the equations.

While in the above embodiment the amount k is calculated according to the Lambert-Beer's law, it may be calculated according to the Yule-Nielsen's equation or other equations. Alternatively, the amount k may be obtained by other various methods, for instance, by referencing a LUT provided by measuring $\rho(k)$ in advance. While in the above embodiment k' is given as a function of k, it may be given as a function of the lightness L* or chroma C* of the input color signals, or a function of both.

In the above example, in some cases, for instance, when the input color signals are outside the color gamut of an output device, a color needs to be mapped to a point inside the color gamut of the output device. The color conversion apparatus can easily be adapted to perform mapping of the color A or A' to a color inside the color gamut of the output device in addition to the determination of the chromaticity values of the color A or A' that is represented by the three colors C, M and Y.

As described above, according to the invention, the input color signals are separated into the color of the chromatic components and the color of the achromatic component, and then the chromaticity values of the color of the chromatic components are determined. The chromatic colorant amounts are determined from the chromaticity values thus determined. Therefore, the colorant amounts can be determined easily, and the color conversion can be performed with high accuracy and with only a small color difference from the input color signals. Further, even if the achromatic colorant amount is changed, the output color can be kept approximately equal to the input color signals, i.e., almost no variation occurs in the output color.

What is claimed is:

1. A color conversion apparatus for converting input color signals representing an input image into amounts of a plurality of chromatic colorants and at least one achromatic colorant to reproduce the input image on an image supporting member with those colorants, said apparatus comprising:

means for determining an amount of the achromatic colorant from the input color signals;

means for determining chromaticity values of a color of chromatic components obtained by subtracting the determined amount of the achromatic colorant from the input color signals, including:

means for determining a reflectance $\rho(k')$ of the achromatic colorant from the amount k' of the achromatic colorant; and means for determining the chromaticity values L*, H* and C* according to equations:

$$L^* = \rho(k')^{-\frac{1}{3}}(L^*_0+16)-16$$

$$H^* = H^*_0$$

$$C^* = \rho(k')^{-\frac{1}{3}}C^*_0$$

where $L^*_0$, $H^*_0$ and $C^*_0$ denote chromaticity values of the input color signals; and means for determining amounts of the chromatic colorants for representing the color of the chromatic components from the determined chromaticity values.

2. The color conversion apparatus of claim 1, wherein the achromatic colorant amount determining means comprises means for allowing the amount of the achromatic colorant to be determined from the input color signals in a variable manner.

3. The color conversion apparatus of claim 1, wherein the achromatic colorant amount determining means comprises means for determining a reference amount of the achromatic colorant for a GCR ratio of 100% from the input color signals, and means for converting the reference amount to the amount of the achromatic colorant using a function that is set in accordance with a type of the input image.

* * * * *